(12) United States Patent
Fujita et al.

(10) Patent No.: US 12,401,367 B2
(45) Date of Patent: Aug. 26, 2025

(54) PLL CIRCUIT AND TRANSMISSION SYSTEM

(71) Applicant: Nuvoton Technology Corporation Japan, Kyoto (JP)

(72) Inventors: Mayuko Fujita, Osaka (JP); Akinori Shimmyo, Hyogo (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 24 days.

(21) Appl. No.: 18/441,724

(22) Filed: Feb. 14, 2024

(65) Prior Publication Data

US 2024/0187006 A1    Jun. 6, 2024

Related U.S. Application Data

(63) Continuation of application No. PCT/JP2022/031746, filed on Aug. 23, 2022.

(30) Foreign Application Priority Data

Aug. 25, 2021   (JP) .................... 2021-137169

(51) Int. Cl.
*H03L 7/099*   (2006.01)
*H03K 5/1252*   (2006.01)
*H03L 7/083*   (2006.01)

(52) U.S. Cl.
CPC ......... *H03L 7/0992* (2013.01); *H03K 5/1252* (2013.01); *H03L 7/083* (2013.01)

(58) Field of Classification Search
CPC ..... H03L 7/0992; H03L 7/083; H03L 7/0891; H03L 7/143; H03L 7/195; H03K 5/1252
See application file for complete search history.

(56) References Cited

U.S. PATENT DOCUMENTS

| 4,864,253 | A | * | 9/1989 | Zwack | ................ | H03L 7/181 |
| | | | | | | 331/25 |
| 4,943,788 | A | * | 7/1990 | Laws | .................. | H04L 7/033 |
| | | | | | | 331/25 |
| 5,278,814 | A | * | 1/1994 | Deguchi | ............ | G11B 20/1403 |
| | | | | | | 369/53.29 |
| 5,523,900 | A | * | 6/1996 | Kosugi | .............. | G11B 5/59616 |

(Continued)

FOREIGN PATENT DOCUMENTS

| AU | 7735301 | A | * | 4/2002 | .............. | H03L 7/113 |
| CN | 1117183 | A | * | 2/1996 | ....... | G11B 20/10527 |

(Continued)

OTHER PUBLICATIONS

Extended European Search Report dated Nov. 22, 2024 issued in the corresponding European Patent Application No. 22861366.7.
(Continued)

*Primary Examiner* — Berhanu Tadese
(74) *Attorney, Agent, or Firm* — Rimon P.C.

(57) ABSTRACT

A phase-locked loop (PLL) circuit generates an output clock signal and includes: a selection circuit that selects one of a plurality of clock signals as a reference clock signal of the PLL circuit; and a control circuit that when a switch is made for the selection of the reference clock signal, temporarily reduces a division ratio used by a frequency divider that generates a feedback clock signal to be compared with the reference clock signal.

10 Claims, 6 Drawing Sheets

(56) References Cited

U.S. PATENT DOCUMENTS

| | | | | |
|---|---|---|---|---|
| 5,675,274 A * | 10/1997 | Kobayashi | H03L 7/0816 | 327/158 |
| 5,689,536 A * | 11/1997 | Iyota | H03L 7/0807 | 331/49 |
| 5,907,263 A * | 5/1999 | Divine | H03L 7/099 | 331/34 |
| 6,182,236 B1 * | 1/2001 | Culley | H03L 7/087 | 713/400 |
| 6,208,183 B1 * | 3/2001 | Li | H03L 7/0995 | 327/158 |
| 6,269,061 B1 * | 7/2001 | Shimizume | G11B 19/00 | 369/47.33 |
| 6,307,411 B1 * | 10/2001 | Kerner | H03L 7/087 | 375/376 |
| 6,341,149 B1 * | 1/2002 | Bertacchini | H04J 3/0688 | 375/373 |
| 6,349,391 B1 * | 2/2002 | Petivan | G06F 11/181 | 714/E11.061 |
| 6,362,670 B1 * | 3/2002 | Beaulieu | H03L 7/18 | 327/159 |
| 6,701,445 B1 * | 3/2004 | Majos | H04L 7/033 | 327/156 |
| 6,968,025 B2 * | 11/2005 | Tanahashi | H03L 7/0816 | 375/357 |
| 7,126,429 B2 * | 10/2006 | Mitric | H03L 7/143 | 331/16 |
| RE41,031 E * | 12/2009 | Majos | H04L 7/033 | 713/502 |
| 7,737,739 B1 * | 6/2010 | Bi | H03L 7/06 | 327/135 |
| 8,077,822 B2 * | 12/2011 | Sun | H03L 7/0802 | 375/376 |
| 8,222,933 B2 * | 7/2012 | Nagaraj | H03L 7/0802 | 375/376 |
| 8,842,490 B2 * | 9/2014 | Quach | G11C 11/4076 | 365/230.02 |
| 9,318,171 B2 * | 4/2016 | Van Huben | G11C 5/04 | |
| 9,343,126 B2 * | 5/2016 | Baliga | G11C 8/18 | |
| 9,395,745 B2 * | 7/2016 | Zhu | H03K 5/14 | |
| 9,531,390 B1 * | 12/2016 | Choi | H03L 7/23 | |
| 10,234,895 B2 * | 3/2019 | Jin | H03L 7/093 | |
| 10,516,402 B2 * | 12/2019 | Lindgren | H03L 7/08 | |
| 10,523,219 B2 * | 12/2019 | Tamura | H03L 7/081 | |
| 10,727,845 B1 * | 7/2020 | Balakrishnan | H03L 7/183 | |
| 10,790,838 B1 * | 9/2020 | Mosalikanti | H03L 7/085 | |
| 11,031,945 B1 * | 6/2021 | Maltabas | H03L 7/18 | |
| 11,233,518 B2 * | 1/2022 | Tak | H03L 7/08 | |
| 11,671,104 B2 * | 6/2023 | Tak | H03L 7/0891 | 375/376 |
| 11,923,860 B2 * | 3/2024 | Tsuji | H03L 7/0992 | |
| 2001/0015678 A1 * | 8/2001 | Wesolowski | H04J 3/0688 | 331/25 |
| 2009/0115472 A1 * | 5/2009 | Pfaff | H03L 7/06 | 327/156 |
| 2012/0139593 A1 * | 6/2012 | Saito | H03L 7/087 | 327/156 |
| 2012/0166859 A1 * | 6/2012 | Fernald | H04L 7/033 | 713/501 |
| 2014/0281326 A1 * | 9/2014 | Van Huben | G06F 13/42 | 711/167 |
| 2019/0068205 A1 * | 2/2019 | Tamura | H03L 7/0995 | |
| 2024/0187006 A1 * | 6/2024 | Fujita | H03K 5/1252 | |

FOREIGN PATENT DOCUMENTS

| | | | | |
|---|---|---|---|---|
| CN | 1031846 C | * | 5/1996 | |
| CN | 1257349 A | * | 6/2000 | H04J 3/0688 |
| CN | 1084910 C | * | 5/2002 | G11B 19/26 |
| CN | 1475980 A | * | 2/2004 | G09G 3/296 |
| CN | 1186877 C | * | 1/2005 | H03L 7/0993 |
| CN | 1799190 A | * | 7/2006 | H03K 7/08 |
| CN | 102609386 A | * | 7/2012 | H04L 7/033 |
| CN | 103141030 A | * | 6/2013 | H03L 7/0991 |
| CN | 203387495 U | * | 1/2014 | |
| CN | 102609386 B | * | 4/2016 | H03L 7/087 |
| CN | 103026629 B | * | 2/2018 | |
| CN | 114415964 A | * | 4/2022 | G06F 3/0683 |
| CN | 107870741 B | * | 5/2022 | G06F 3/0683 |
| CN | 114747145 A | * | 7/2022 | H03L 7/24 |
| CN | 110024288 B | * | 6/2023 | H03K 5/05 |
| CN | 117837087 A | * | 4/2024 | H03L 7/143 |
| CN | 114415964 B | * | 9/2024 | G11C 16/32 |
| CN | 118801874 A | * | 10/2024 | H03L 7/0992 |
| DE | 60031737 T2 | * | 9/2007 | H03L 7/091 |
| DE | 112020005951 T5 | * | 10/2022 | H03L 7/24 |
| EP | 0321725 A2 | * | 6/1989 | H03L 7/181 |
| EP | 0209306 B1 | * | 6/1992 | H04L 7/033 |
| EP | 0321725 B1 | * | 1/1994 | H03L 7/085 |
| EP | 0649131 A2 | * | 4/1995 | G11B 19/02 |
| EP | 1049285 A1 | * | 11/2000 | H03L 7/087 |
| EP | 0649131 B1 | * | 12/2000 | G11B 19/04 |
| EP | 1198064 A2 | * | 4/2002 | H03L 7/113 |
| EP | 1049285 B1 | * | 11/2006 | H04L 7/033 |
| EP | 3700091 A1 | | 8/2020 | |
| EP | 4395178 A1 | * | 7/2024 | H03L 7/143 |
| FI | 91820 C | * | 8/1994 | H03L 7/181 |
| FR | 2724511 A1 | * | 3/1996 | H03L 7/07 |
| JP | H08-018447 A | | 1/1996 | |
| JP | H08102137 A | * | 4/1996 | |
| JP | H08-228149 A | | 9/1996 | |
| JP | H0983396 A | * | 3/1997 | H04B 15/06 |
| JP | H1013383 A | * | 1/1998 | |
| JP | H1022822 A | * | 1/1998 | H03L 7/089 |
| JP | H10261958 A | * | 9/1998 | |
| JP | 2000341113 A | * | 12/2000 | H04L 7/033 |
| JP | 2001094420 A | * | 4/2001 | |
| JP | 2002204161 A | * | 7/2002 | H03L 7/0992 |
| JP | 2003-243980 A | | 8/2003 | |
| JP | 2004015659 A | * | 1/2004 | |
| JP | 2004037939 A | * | 2/2004 | |
| JP | 2005252587 A | * | 9/2005 | |
| JP | 2005277880 A | * | 10/2005 | |
| JP | 2007049217 A | * | 2/2007 | |
| JP | 2007266923 A | * | 10/2007 | H03L 7/104 |
| JP | 2011170644 A | * | 9/2011 | |
| JP | 2011211288 A | * | 10/2011 | H04B 10/29 |
| JP | 2014158195 A | * | 8/2014 | |
| JP | 2018011277 A | * | 1/2018 | |
| JP | 2018038038 A | * | 3/2018 | H10D 86/60 |
| JP | 2019204998 A | * | 11/2019 | H03L 7/095 |
| JP | 2021010096 A | * | 1/2021 | |
| KR | 930007157 B1 | * | 7/1993 | G11B 7/0079 |
| KR | 20010014133 A | * | 2/2001 | H03L 7/113 |
| KR | 20020029621 A | * | 4/2002 | H03L 7/087 |
| KR | 20180033368 A | * | 4/2018 | G11C 29/028 |
| NZ | 514595 A | * | 4/2003 | H03L 7/113 |
| SU | 1293841 A1 | * | 2/1987 | |
| TW | 419901 B | * | 1/2001 | H03L 7/113 |
| TW | 1270837 B | * | 1/2007 | G09G 5/006 |
| WO | WO-2012088275 A1 | * | 6/2012 | H04L 7/033 |
| WO | WO-2012150621 A1 | * | 11/2012 | H03L 7/1974 |
| WO | WO-2017150241 A1 | * | 9/2017 | H03L 7/081 |
| WO | WO-2019225135 A1 | * | 11/2019 | H03L 7/095 |
| WO | WO-2023027078 A1 | * | 3/2023 | H03L 7/143 |

OTHER PUBLICATIONS

International Search Report dated Nov. 15, 2022 issued in International Patent Application No. PCT/JP2022/031746, with English translation.

\* cited by examiner

PLL CIRCUIT AND TRANSMISSION SYSTEM

CROSS REFERENCE TO RELATED APPLICATIONS

This is a continuation application of PCT International Application No. PCT/JP2022/031746 filed on Aug. 23, 2022, designating the United States of America, which is based on and claims priority of Japanese Patent Application No. 2021-137169 filed on Aug. 25, 2021. The entire disclosures of the above-identified applications, including the specifications, drawings and claims are incorporated herein by reference in their entirety.

FIELD

The present invention relates to a PLL circuit and a transmission system that can switch a reference clock signal.

BACKGROUND

Patent Literature (PTL) 1 proposes a phase-locked loop (PLL) circuit, which can switch a reference clock signal, that generates no phase shift between a reference clock signal and a comparison clock signal when the reference clock signal is switched and obtains stable output also at the time of switching, which can be achieved with a simple configuration.

CITATION LIST

Patent Literature

PTL 1: Japanese Unexamined Patent Application Publication No. 2003-243980

SUMMARY

Technical Problem

According to PTL 1, however, there is a case where there is still a phase shift between a reference clock signal and a comparison clock signal when the reference clock signal is switched, and the problem is that frequency fluctuation may occur.

In view of this, the present disclosure has an object to provide a PLL circuit and a transmission system that inhibit frequency fluctuation at the time of switching a reference clock signal.

Solution to Problem

To achieve the above object, a PLL circuit according to one aspect of the present disclosure generates an output clock signal and includes: a selection circuit that selects one of a plurality of clock signals as a reference clock signal of the PLL circuit; and a control circuit that when a switch is made for the selection of the reference clock signal, temporarily reduces a division ratio used by a frequency divider that generates a feedback clock signal to be compared with the reference clock signal.

A transmission system according to one aspect of the present disclosure includes: the above-described PLL circuit; a converter that converts parallel data into serial data in synchronization with the output clock signal; and a transmission driver that outputs the serial data to a communication line.

Note that these general or specific aspects may be achieved by a system, a method, an integrated circuit, or any combination thereof.

Advantageous Effects

With the PLL circuit and transmission system according to the present disclosure, frequency fluctuation at the time of switching a reference clock signal can be inhibited.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENT (Underlying Knowledge Forming Basis of the Present Disclosure)

Figure 11:
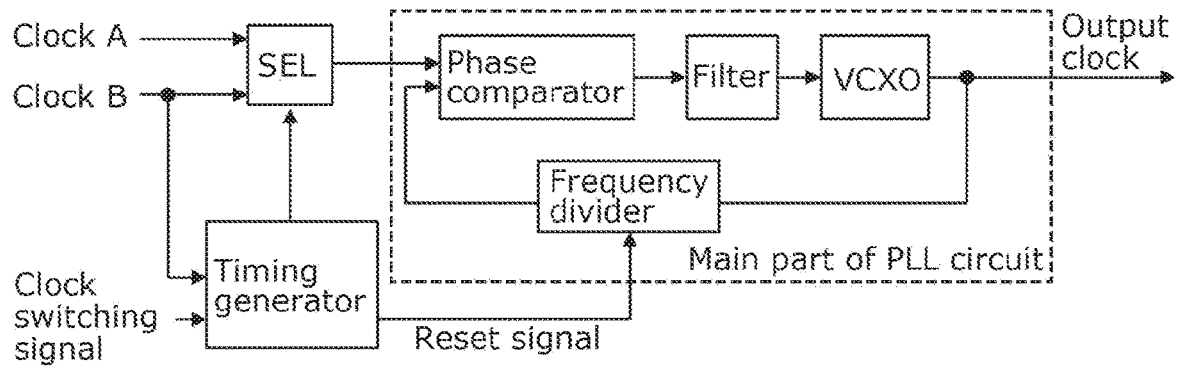
FIG. 11 is a block diagram illustrating the configuration of a PLL circuit according to conventional techniques.
Figure 12:
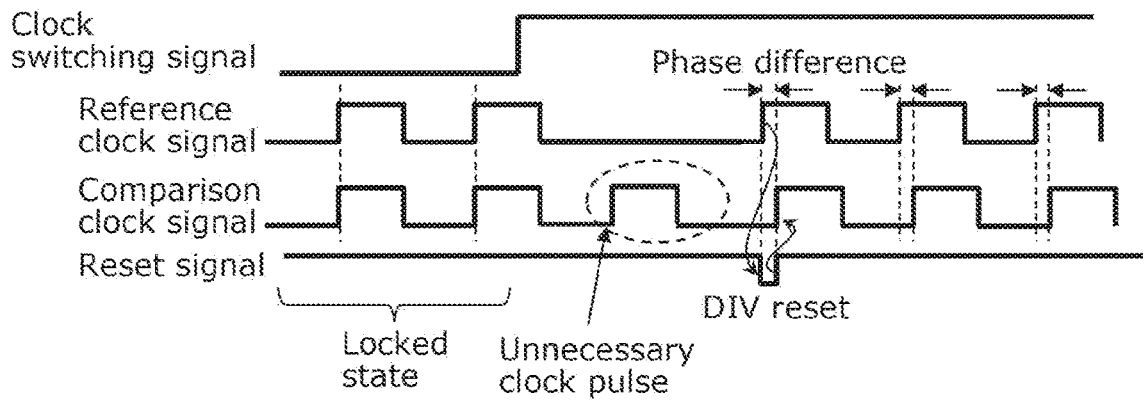
FIG. 12 is a time chart illustrating an operation that may occur when using the conventional techniques.

The inventors have found that the following problems related to the PLL circuit according to the conventional techniques which is mentioned in the "Background Art" section occur. FIG. 11 is a diagram illustrating the configuration of the conventional PLL circuit. This PLL circuit corresponds to the circuit in FIG. 1 of PTL 1. FIG. 12 is a time chart showing an operation that may be generated by reference clock signal switching in FIG. 11.

In FIG. 12, a clock switching signal is a signal that instructs switching of a reference clock signal. A reference clock signal is a signal to be output from the selector to the phase comparator. A comparison clock signal is a signal to be output from the frequency divider to the phase comparator. A reset signal is a signal to be output from the timing generator to the frequency divider.

In a period in which the clock switching signal is at low-level in FIG. 12, clock A is selected as a reference clock signal and the reference clock signal is in a locked state. After the clock switching signal is changed from low-level to high-level, the reference clock signal is switched from clock A to clock B.

The reset signal is asserted (a negative logic pulse is output) at the timing of the first edge (the rising edge in FIG. 12) of the reference clock signal after the reference clock signal is switched, and clears the counter of the frequency divider. The operation of the counter of the frequency divider stops only for the pulse width of the reset signal (the duration of L level). The phase difference between the reference clock signal and the comparison clock signal occurs only during a time corresponding to the pulse width.

Even when the frequency of clock A is same as the frequency of clock B, the phase difference is transmitted to voltage-controlled oscillator VCXCO via a filter, and frequency fluctuation occurs.

If the frequency divider is provided with a synchronization circuit that synchronizes a reset timing (i.e., the rising timing of a reset pulse) with an output clock signal, the reset timing is delayed and the phase difference further increases.

As shown in the dotted circle in FIG. 12, when the stop period of the reference clock signal is long at the time of clock switching, a clock pulse unnecessary for the comparison clock signal may occur during the stop period. This unnecessary clock pulse may be a factor that causes a frequency to fluctuate greatly.

Figure 13:
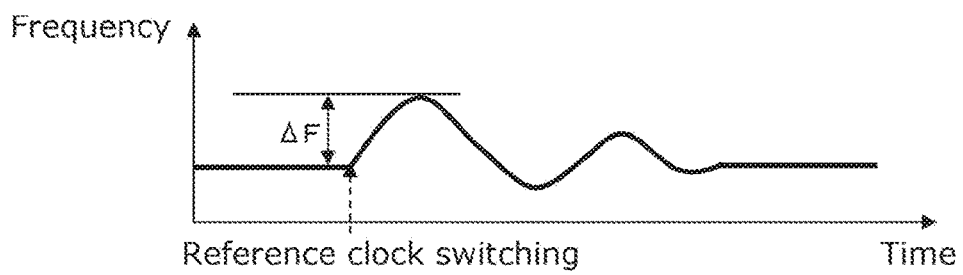
FIG. 13 is an illustration showing frequency fluctuation that may occur in a clock switching operation according to the conventional techniques.

FIG. 13 is an illustration showing frequency fluctuation that may be caused in a conventional clock switching operation. As illustrated in FIG. 13, frequency fluctuation $\Delta F$ occurs at the time of reference clock signal switching. In one example of a general PLL circuit before the appearance of the PLL circuit according to PTL 1, $\Delta F$ may increase to approximately 30000 ppm. Although it is conceivable that the PLL circuit according to PTL 1 can reduce frequency fluctuation $\Delta F$ to less than 30000 ppm, the problems described above still remain to be overcome.

Figure 14:
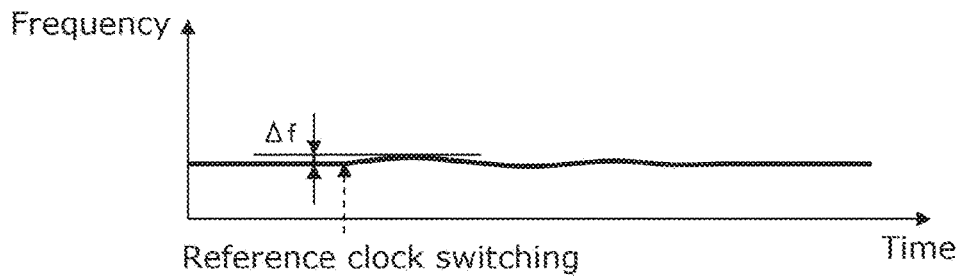
FIG. 14 is an illustration showing reduced frequency fluctuation in a clock switching operation.

In recent years, there has been a demand that frequency fluctuation $\Delta f$ at the time of reference clock signal switching be further reduced ($\Delta f \ll \Delta F$) as illustrated in FIG. 14. For example, the universal serial bus 4 (USB4) standard requires $\Delta f = 1400$ ppm or less.

In view of this, the present disclosure provides a PLL circuit and a transmission system that inhibit frequency fluctuation at the time of reference clock signal switching.

To overcome the above problems, a PLL circuit according to one aspect of the present disclosure generates an output clock signal and includes: a selection circuit that selects one of a plurality of clock signals as a reference clock signal of the PLL circuit; and a control circuit that when a switch is made for the selection of the reference clock signal, temporarily reduces a division ratio used by a frequency divider that generates a feedback clock signal to be compared with the reference clock signal.

A transmission system according to one aspect of the present disclosure includes the above-described PLL circuit; a converter that converts parallel data into serial data in synchronization with the output clock signal; and a transmission driver that outputs the serial data to a communication line.

Note that these general or specific aspects may be achieved by a system, a method, an integrated circuit, a computer program, or any combination thereof.

Hereinafter, an embodiment of a PLL circuit and a transmission system according to one aspect of the present disclosure will be described in detail with reference to the drawings.

Note that the embodiment described below shows a general or specific example of the present disclosure. Numerical values, shapes, materials, elements, the arrangement and connection of the elements, steps, orders of steps, etc., indicated in the following embodiment are merely examples, and do not intend to limit the present disclosure. Among elements in the following embodiment, those not recited in any of the independent claims reciting the broadest concept are described as optional elements.

EMBODIMENT

[1.1 Configuration of PLL Circuit]

First, the configuration of a PLL circuit according to an embodiment will be described.

Figure 1:
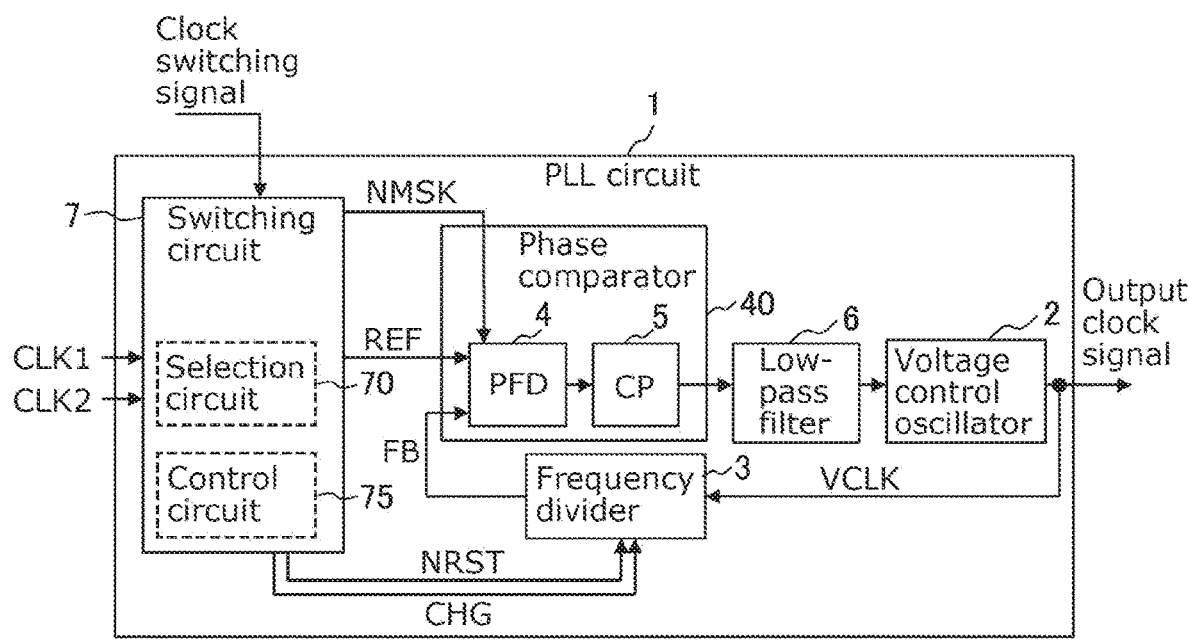
FIG. 1 is a block diagram illustrating an example of the configuration of a PLL circuit according to an embodiment.

FIG. 1 is a block diagram illustrating an example of the configuration of PLL circuit 1 according to the embodiment. PLL circuit 1 in FIG. 1 includes voltage-controlled oscillator 2, frequency divider 3, phase comparator 40, low-pass filter 6, and switching circuit 7.

Voltage-controlled oscillator (VCO) 2 oscillates at a frequency according to a control voltage from low-pass filter 6 to generate output clock signal VCLK.

Frequency divider 3 divides the frequency of output clock signal VCLK and outputs the result of the frequency division as feedback clock signal FB to phase comparator 40. Frequency divider 3 is reset by reset signal NRST and is brought into a stopped state. Frequency divider 3 changes a division ratio to start frequency division while division ratio switching signal CHG is asserted. The division ratio is N when the frequency of output clock signal VCLK is multiplied by 1/N. N may be a positive integer.

Phase comparator 40 detects the phase difference between feedback clock signal FB output from frequency divider 3 and reference clock signal REF. For this reason, phase comparator 40 includes, for example, phase frequency detector (PFD) 4 and charge pump (CP) 5.

PFD 4 detects the phase difference and frequency difference between reference clock signal REF and feedback clock signal FB. Hereinafter, a phase difference and a frequency difference are not specifically distinguished from each other and are each simply referred to as a phase difference.

CP 5 outputs or inputs a current in accordance with the detected phase difference.

Low-pass filter 6 outputs a control voltage in accordance with the detected phase difference to voltage-controlled oscillator 2. Specifically, low-pass filter 6 generates a control voltage by converting the current output or input from CP 5 into a smoothed voltage.

Switching circuit 7 is a circuit that switches reference clock signal REF according to a clock switching signal. For this reason, switching signal 7 includes selection circuit 70 and control circuit 75.

Selection circuit 70 selects one of clock signals according to a clock switching signal and outputs the selected clock signal to phase comparator 40 as reference clock signal REF. Two examples of the clock signals, first clock signal CLK1 and second clock signal CLK2, are illustrated in FIG. 1. First clock signal CLK1 and second clock signal CLK2 may be clock signals with the same frequency and different phases, and may be, for example, recovery clocks or any clocks other than recovery clocks. A recovery clock is a clock signal that is reproduced in accordance with the timing at which received serial data is changed.

Control circuit 75 performs control to temporarily reduce the division ratio used by frequency divider 3 at the time of switching for the selection of reference clock signal REF. Control circuit 75 also performs control of temporarily masking a detection result obtained by phase comparator 40 at the time of switching for the selection of reference clock signal REF.

Temporarily reducing a division ratio in frequency divider 3 temporarily reduces the cycle of feedback clock signal FB. When the first edge timing of feedback clock signal FB from frequency divider 3 is little delayed relative to the first edge timing of reference clock signal REF immediately after switching, for example, it is possible to match the edge timing of reference clock signal REF in the next cycle with the edge timing of feedback clock signal FB in the next cycle. As a result, the frequency fluctuation of output clock signal VCLK which is caused by the switching of reference clock signal REF can be inhibited.

At the time of switching for the selection of a reference clock signal, an extra clock pulse of one of the reference clock signal and the feedback clock signal may be output by mistake at the time of switching for the selection of a reference clock signal, but a phase difference due to this extra pulse can be masked in the masking control.

[1.2 Configuration of Switching Circuit]

Next, the detailed configuration of switching circuit 7 will be described.

Figure 2:
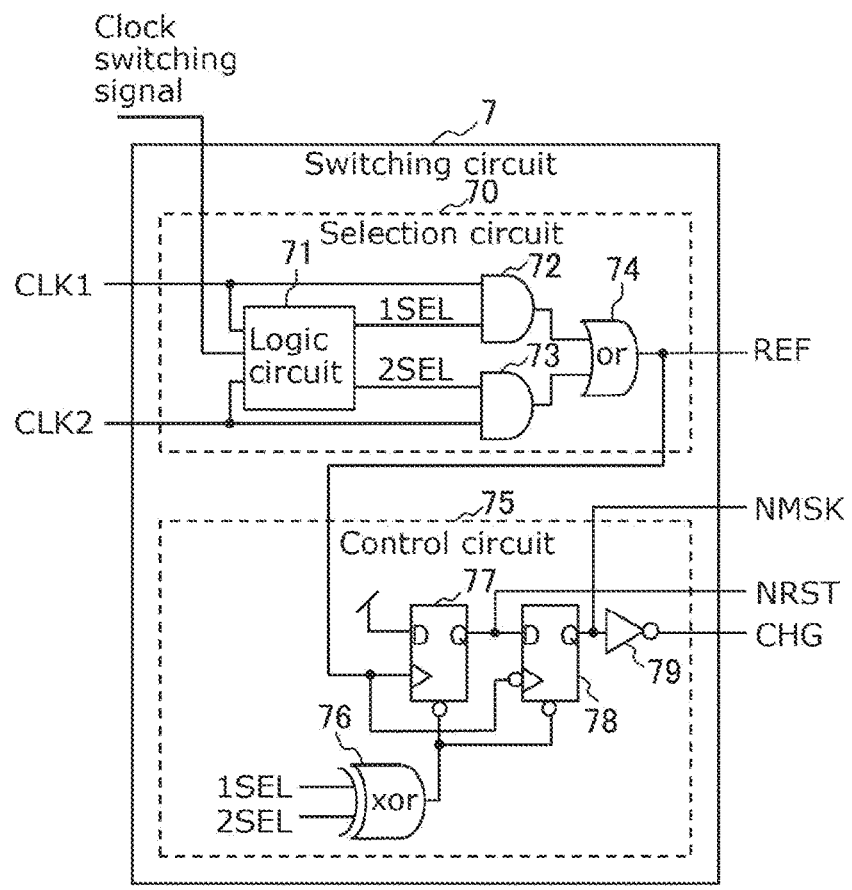
FIG. 2 is a circuit diagram illustrating an example of the configuration of the switching circuit in FIG. 1.

FIG. 2 is a circuit diagram illustrating an example of the configuration of switching circuit 7 in FIG. 1. In FIG. 2, switching circuit 7 includes selection circuit 70 and control circuit 75.

Selection circuit 70 includes logic circuit 71, AND circuit 72, AND circuit 73, and OR circuit 74. In FIG. 2, a clock switching signal instructs one of first clock signal CLK1 and second clock signal CLK2 at low-level and instructs the other of first clock signal CLK1 and second clock signal CLK2 at high-level.

In logic circuit 71, a clock switching signal, first clock signal CLK1 and second clock signal CLK2 are input, and one of first clock selection signal 1SEL and second clock selection signal 2SEL is raised to high-level, i.e., made active. However, immediately after the clock switching signal is changed, i.e., immediately after the switching of reference clock signal REF is instructed, logic circuit 71 provides a non-selection period during which both of first clock selection signal 1SEL and second clock selection signal 2SEL are temporarily lowered to low-level. The non-selection period is provided to prevent glitch noise from OR circuit 74, which is caused by the switching of reference clock signal REF, from being made or generated. As used herein, a glitch is a whisker-like pulse that has a short width and is not intended. When this pulse affects the circuit in the next step and the following steps, the pulse is referred to as "glitch noise".

AND circuit 72 outputs the logical conjunction of first clock signal CLK1 and first clock selection signal 1SEL. In other words, AND circuit 72 outputs first clock signal CLK1 when first clock selection signal 1SEL is at high-level, and does not output first clock signal CLK1 but outputs low-level when first clock selection signal 1SEL is at low-level.

AND circuit 73 outputs the logical conjunction of second clock signal CLK2 and second clock selection signal 2SEL.

In other words, AND circuit 73 outputs second clock signal CLK2 when second clock selection signal 2SEL is at high-level, and does not output second clock signal CLK2 but outputs low-level when second clock selection signal 2SEL is at low-level.

OR circuit 74 outputs the logical disjunction of the output of AND circuit 72 and the output of switching circuit 7. OR circuit 74 outputs one of first clock signal CLK1 and second clock signal CLK2 as reference clock signal REF. However, OR circuit 74 outputs neither first clock signal CLK1 nor second clock signal CLK2 and outputs low-level in the non-selection period.

Control circuit 75 includes XOR circuit 76, flip-flop 77, flip-flop 78, and inversion circuit 79. With this, control circuit 75 generates various control signals for performing control of temporarily reducing a division ratio and control of temporarily masking a detection result obtained by phase comparator 40.

XOR circuit 76 outputs the exclusive logical disjunction of first clock selection signal 1SEL and second clock selection signal 2SEL. The output of XOR circuit 76 is input to the reset terminals of flip-flop 77 and flip-flop 78. As a result, XOR circuit 76 resets flip-flop 77 and flip-flop 78 when both of first clock selection signal 1SEL and second clock selection signal 2SEL are lowered to low-level. In other words, XOR circuit 76 brings flip-flop 77 and flip-flop 78 into a reset state in the non-selection period, and cancels the reset state when one of first clock selection signal 1SEL and second clock selection signal 2SEL is raised to high-level. An OR circuit may be used instead of XOR circuit 76.

High-level is always input to the D input terminal of flip-flop 77. Reference clock signal REF is input to the clock input terminal of flip-flop 77. The output signal of XOR circuit 76 is input to the reset input terminal of flip-flop 77. As a result, in flip-flop 77, the Q output terminal is changed from high-level to low-level at the start timing of the non-selection period and is then changed to high-level at the first rising edge of reference clock signal REF after the non-selection period is ended. The signal of the Q output terminal is output as reset signal NRST to frequency divider 3.

The Q output terminal of flip-flop 77 is connected to the D input terminal of flip-flop 78 and reset signal NRST is input to the D input terminal of flip-flop 78. Reference clock signal REF is input to the inversion clock input terminal of flip-flop 78. The output signal of XOR circuit 76 is input to the reset input terminal of flip-flop 78. As a result, the Q output terminal of flip-flop 78 is changed from high-level to low-level at the start timing of the non-selection period, and flip-flop 78 takes in reset signal NRST from the D input terminal and outputs reset signal NRST from the Q output terminal at the first falling edge of reference clock signal REF after the non-selection period is ended. The signal of the Q output terminal is output as mask signal NMSK to phase comparator 40.

Inversion circuit 79 inverts mask signal NMSK and outputs the inverted signal as division ratio switching signal CHG to frequency divider 3.

Operations using various signals in FIG. 2 will be described later with reference to FIG. 7.

[1.3 Configuration of Frequency Divider]

Next, the detailed configuration of frequency divider 3 will be described.

Figure 3:
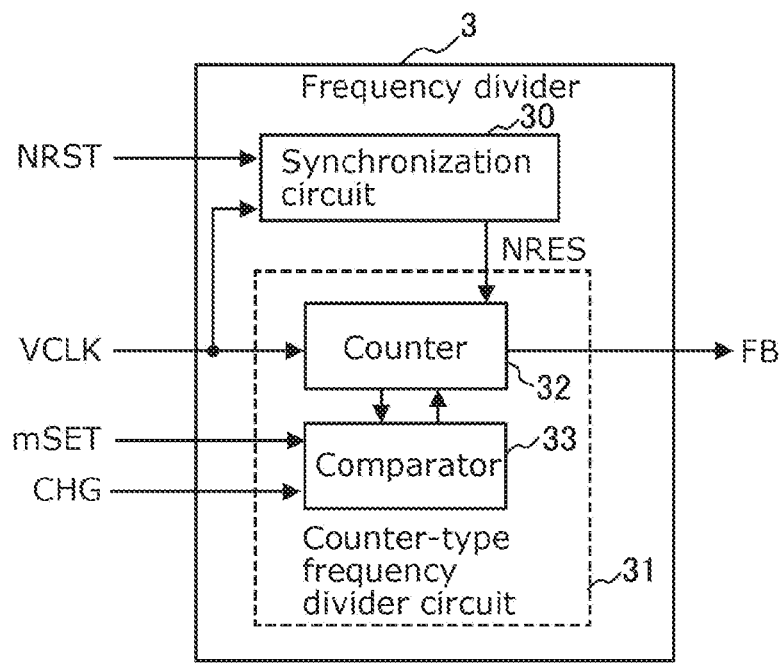
FIG. 3 is a circuit diagram illustrating an example of the configuration of the frequency divider in FIG. 1.
Figure 4:
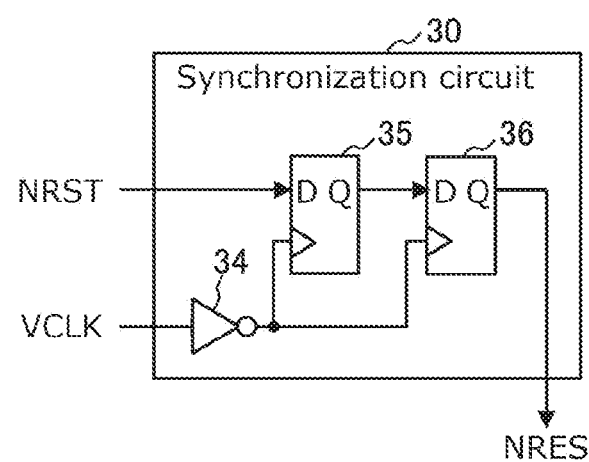
FIG. 4 is a circuit diagram illustrating an example of the configuration of the synchronization circuit in FIG. 3.

FIG. 3 is a circuit diagram illustrating an example of the configuration of frequency divider 3 in FIG. 1. FIG. 4 is a circuit diagram illustrating an example of the configuration of synchronization circuit 30 in FIG. 3.

As illustrated in FIG. 3, frequency divider 3 includes synchronization circuit 30 and counter-type frequency divider circuit 31. Counter-type frequency divider circuit 31 includes counter 32 and comparator 33.

Synchronization circuit 30 is a circuit that causes reset signal NRST to synchronize with output clock signal VCLK. For this reason, synchronization circuit 30 includes, in the configuration example in FIG. 4, inversion circuit 34, flip-flop 35, and flip-flop 36.

Inversion circuit 34 inverts output clock signal VCLK and outputs the inverted signal to the clock input terminals of flip-flop 35 and flip-flop 36.

Flip-flop 35 takes in and retains reset signal NRST at the rising edge of the inverted signal from inversion circuit 34 (i.e., at the falling edge of output clock signal VCLK), and outputs the retained signal from the Q output terminal.

Flip-flop 36 takes in and retains the signal from the Q output terminal of flip-flop 35 at the rising edge of the inverted signal from inversion circuit 34 (i.e., at the falling edge of output clock signal VCLK), and outputs the retained signal from the Q output terminal. The signal output from the Q output terminal of flip-flop 36 is output as counter reset signal NRES to counter 32. Counter reset signal NRES is a signal that delayed reset signal NRST for two clock periods of output clock signal VCLK. Stated differently, counter reset signal NRES is a signal that caused reset signal NRST to synchronize with output clock signal VCLK.

Counter-type frequency divider circuit 31 divides the frequency of output clock signal VCLK at division ratio N and outputs feedback clock signal FB. Counter-type frequency divider circuit 31 in the example in FIG. 3 includes counter 32 and comparator 33.

Counter 32 counts the number of clock pulses of output clock signal VCLK.

Comparator 33 compares the count value of counter 32 and division ratio N, and initializes counter 32 when the count value matches division ratio N. Comparator 33 determines whether division ratio (N-m) instructed by division ratio setting signal mSET matches the count value when division ratio switching signal CHG is being asserted. m is an integer corresponding to the time difference between the edge timing of reference clock signal REF immediately after switching and the start timing of frequency divider 3 immediately after reset cancel. In the configuration example in FIG. 3, m denotes the time difference between the rising edge of reset signal NRST and the rising edge of counter reset signal NRES, and corresponds to two clocks of output clock signal VCLK (m=2). Thus, frequency divider 3 performs frequency division at division ratio (N-m) when division ratio switching signal CHG is being asserted.

[1.4 Configuration of Phase Comparator]

Next, the more detailed configuration of phase comparator 40 will be described.

Figure 5:
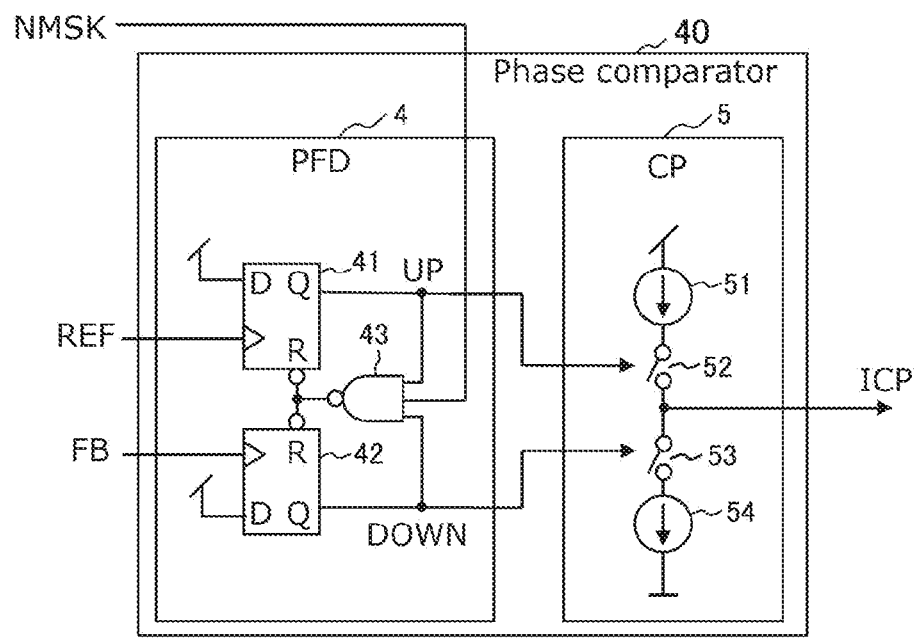
FIG. 5 is a circuit diagram illustrating an example of the configuration of the phase comparator in FIG. 1.

FIG. 5 is a circuit diagram illustrating an example of the configuration of phase comparator 40 in FIG. 1. Phase comparator 40 in FIG. 5 includes PFD 4 and CP 5.

PFD 4 includes flip-flop 41, flip-flop 42, and NAND circuit 43.

Flip-flop 41 outputs low-level from the Q output terminal in a reset state or immediately after reset cancel. In a state other than a reset state, flip-flop 41 takes in and retains the high-level of the D input terminal at the timing of the rising edge of reference clock signal REF, and also outputs high-level as an UP signal from the Q output terminal.

Flip-flop 42 outputs low-level from the Q output terminal in a reset state or immediately after reset cancel. Flip-flop 42 takes in and retains the high-level of the D input terminal at the timing of the rising edge of feedback clock signal FB, and also outputs high-level as a DOWN signal from the Q output terminal.

NAND circuit 43 outputs an output signal obtained by inverting the logical conjunction of the UP signal, the DOWN signal, and mask signal NMSK to the reset input terminal of flip-flop 41 and the reset input terminal of flip-flop 42. When mask signal NMSK is at high-level (i.e., mask signal NBSK is not masked), NAND circuit 43 neither resets flip-flop 41 nor flip-flop 42 when neither the UP signal nor the DOWN signal is at high-level, and resets flip-flop 41 and flip-flop 42 when both of the UP signal and the DOWN signal are at high-level. As a result, when the rising edge of reference clock signal REF is earlier than the rising edge of feedback clock signal FB, a pulse width corresponding to the phase difference between the two signals appears in the UP signal, and a pulse whose duration is short enough to be ignored appears in the DOWN signal. In contrast, when the rising edge of reference clock signal REF is later than the rising edge of feedback clock signal FB, a pulse whose duration is short enough to be ignored appears in the UP signal and a pulse width corresponding to the phase difference between the two signals appears in the DOWN signal. When mask signal NMSK is at low-level, flip-flop 41 and flip-flop 42 are in a reset state. Accordingly, when mask signal NMSK is at low-level, both the UP signal and the DOWN signal are masked.

CP 5 includes current source 51, switch 52, switch 53, and current source 54.

Current source 51 and switch 52 provide low-pass filter 6 with current ICP in accordance with the pulse width of an UP signal. In this case, current ICP flows from CP 5 to low-pass filter 6. As a result, the UP signal works to increase the frequency of output clock signal VCLK via low-pass filter 6 and voltage-controlled oscillator 2.

Switch 53 and current source 54 take out, from low-pass filter 6, current ICP in accordance with the pulse width of a DOWN signal. In this case, current ICP flows from low-pass filter 6 to CP 5. As a result, the DOWN signal works to decrease the frequency of output clock signal VCLK via low-pass filter 6 and voltage-controlled oscillator 2.

[2. Operation]

The following describes an operation of PLL circuit 1 according to the embodiment which is configured as described above.

First, an example of an operation performed in frequency divider 3 will be described.

Figure 6:
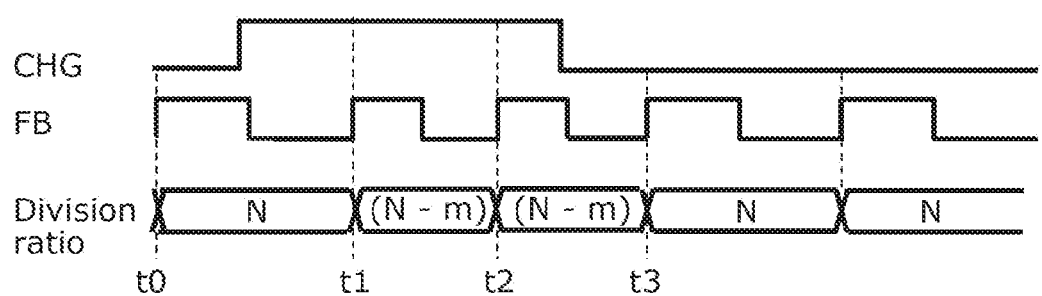
FIG. 6 is a time chart illustrating an example of an operation performed in the frequency divider in FIG. 3.

FIG. 6 is a time chart illustrating an example of an operation performed in frequency divider 3 in FIG. 3. FIG. 3 illustrates the switching timings of division ratio switching signal CHG, feedback clock signal FB, and a division ratio. It is assumed that the rising edge of feedback clock signal FB occurs at a count start timing to start counting in the frequency division operation.

As indicated at time t0 and time t3, the frequency division operation is started at division ratio N when division ratio switching signal CHG is at low-level at the count start timing.

As indicated at time t1 and t2, the frequency division operation is started at division ratio (N-m) when division ratio switching signal CHG is at high-level at the count start timing. m is specified by frequency division setting signal mSET.

Frequency divider 3 thus switches the division ratio in accordance with the level of division ratio switching signal CHG at the count start timing.

When frequency divider 3 is reset in the period from time t0 to time t1, the frequency division operation is stopped in the period from time t0 to time t1 and the pulse of feedback clock signal FB is not to be output.

Next, an example of an operation performed in PLL circuit 1 will be described.

Figure 7:
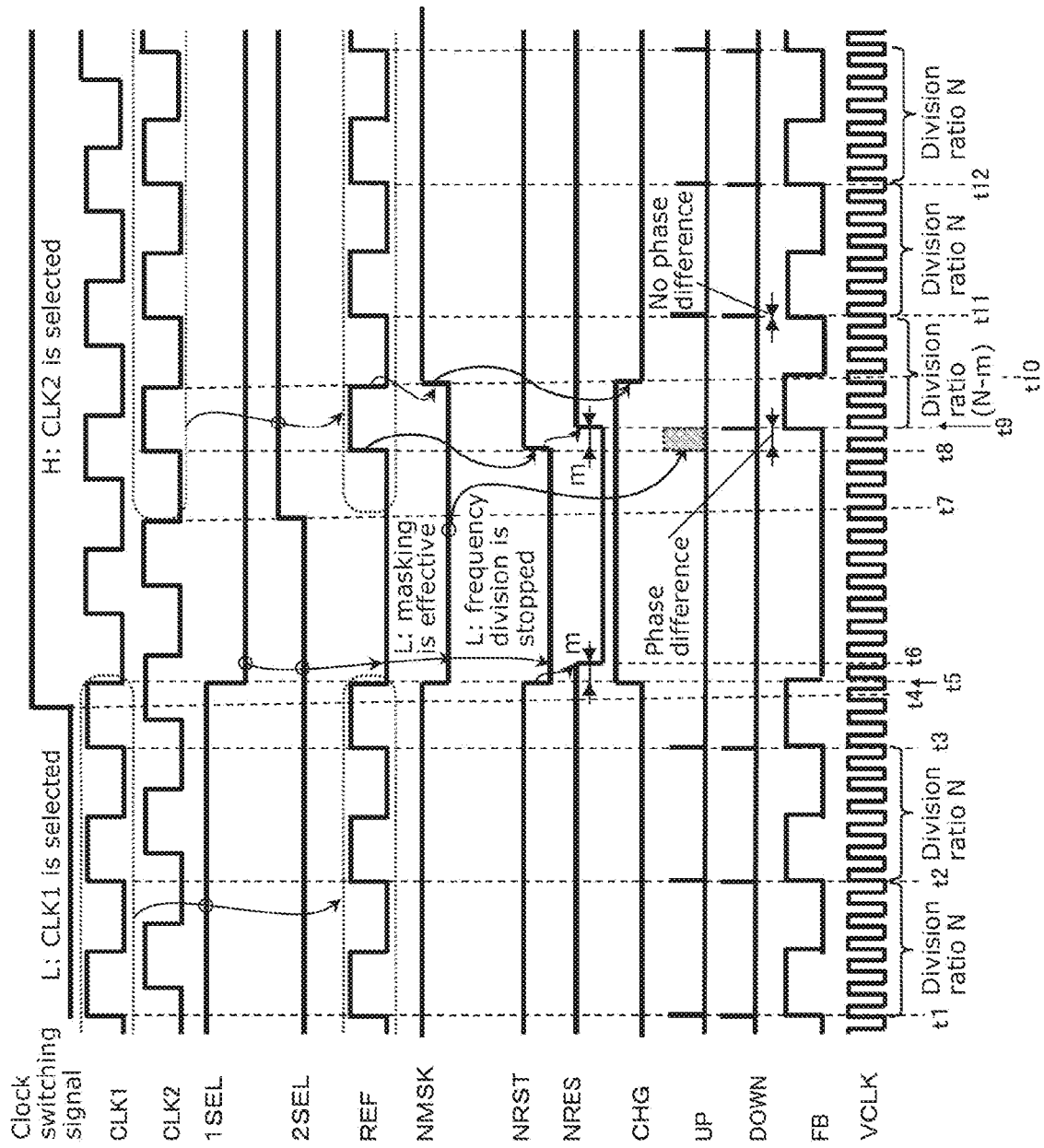
FIG. 7 is a time chart illustrating an example of an operation performed in the PLL circuit according to the embodiment.

FIG. 7 is a time chart illustrating an example of an operation performed in a PLL circuit according to the embodiment.

In the period from time t1 to time t5, first clock signal CLK1 is selected and output as reference clock signal REF in selection circuit 70. In this period, reference clock signal REF and feedback clock signal FB are in a locked state in which the phase of reference clock signal REF matches the phase of feedback clock signal FB, and the UP signal and the DOWN signal each have a pulse width that is short enough to be ignored.

At time t4, the clock switching signal changes from low-level to high-level. In other words, the clock switching signal instructs that reference clock signal REF is to be switched from first clock signal CLK1 to second clock signal CLK2.

With the change in the clock switching signal, selection circuit 70 sets the period from time t5 to time t7 as a non-selection period and lowers both first clock selection signal 1SEL and second clock selection signal 2SEL to low-level.

With both first clock selection signal 1SEL and second clock selection signal 2SEL having been changed to low-level at time t5, the output of reference clock signal REF is stopped. Control circuit 75 changes mask signal NMSK, reset signal NRST, and division ratio switching signal CHG to be active.

In the period from time t5 to time t7, i.e., the non-selection period, reference clock signal REF is not output. At time t7 when second clock selection signal 2SEL is asserted and thereafter, second clock signal CLK2 is selected and output as reference clock signal REF.

In the period from time t5 to time t10, mask signal NMSK becomes active. During this period, the UP signal and the DOWN signal are both masked in phase comparator 40 and neither the UP signal nor the DOWN signal is output. As a result, the UP signal indicating the phase difference from time t8 to time t9 is masked. The DOWN signal in the very short period between time t8 and time t9 is also masked.

In the period from time t5 to time t8, reset signal NRST becomes active. With this, frequency divider 3 stops the frequency division operation.

In the period from time t5 to time t10, division ratio switching signal CHG becomes active. The division ratio of a frequency division operation that is performed by frequency divider 3 and starts in this period is changed. In FIG. 7, the division ratio is changed from N to (N-m).

In the period from time t6 to time t9, counter reset signal NRES becomes active. At time t9, counter reset signal NRES becomes inactive and a frequency division operation at division ratio (N-m) starts.

At time t9, the frequency division operation at ratio (N-m) performed by frequency divider 3 starts and the rising edge of feedback clock signal FB occurs. Here, m=2 and m denotes the time difference between the rising edge of reset signal NRST and the rising edge of counter reset signal NRES. Accordingly, at time t11 when the first cycle of the frequency division operation at division ratio (N-m) is completed, the phase difference between reference clock signal REF and feedback clock signal FB gets closer to 0. At this point in time, PLL circuit 1 is in a locked state and frequency fluctuation is inhibited to a large extent.

At time t11, since division ratio switching signal CHG is not active, a frequency division operation at division ratio N starts.

At time t12, one cycle of the frequency division operation at division ratio N is completed and the phase difference between reference clock signal REF and feedback clock signal FB becomes 0. At this point in time, the locked state of PLL circuit 1 is maintained and frequency fluctuation is inhibited to a large extent.

Thus, in the operation example in FIG. 7, frequency fluctuation at the time of clock switching can be inhibited, as illustrated in FIG. 14.

The example that applies m=2 is illustrated in FIG. 7, but m=1 may be applied. In the case of m=1, the phase difference corresponding to one cycle of output clock signal VCLK remains at time t11 and the phase difference becomes 0 at time t12 in FIG. 7. Even in this case, since PLL circuit 1 is in a locked state at time t12, frequency fluctuation can be sufficiently inhibited. In this way, m may correspond to the time difference between the rising edge of reset signal NRST and the rising edge of counter reset signal NRES, or correspond to the duration of a time less than the time difference.

Figure 8:
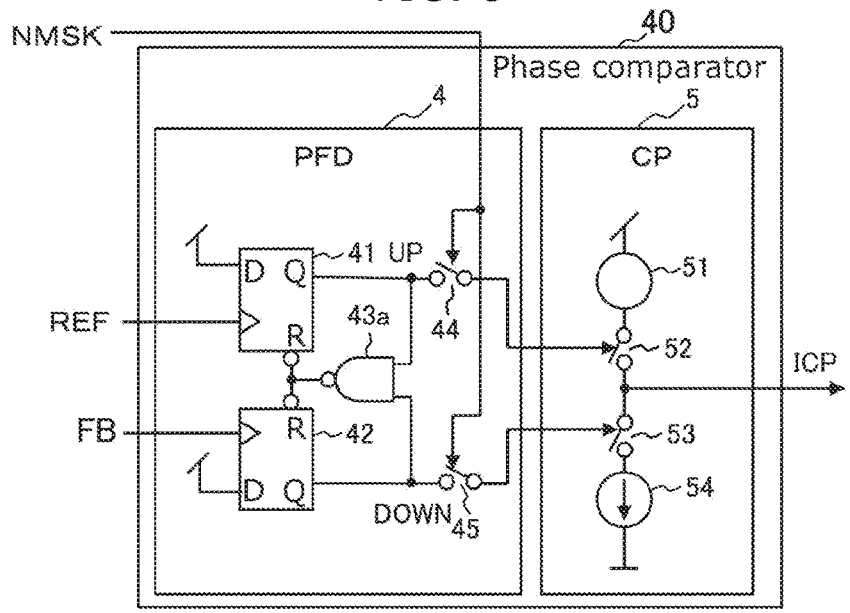
FIG. 8 is a circuit diagram illustrating a variation of the phase comparator in FIG. 5.
Figure 9:
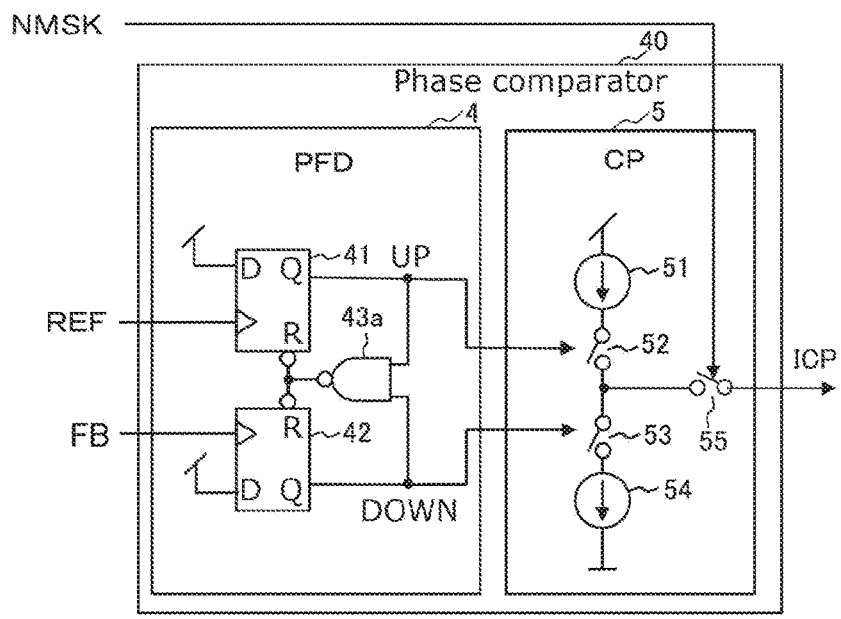
FIG. 9 is a circuit diagram illustrating another variation of the phase comparator in FIG. 5.

Phase comparator 40 may be added in the configuration in FIG. 8 or FIG. 9, instead of FIG. 5. In FIG. 5, mask signal NMSK indirectly masks the UP signal, the DOWN signal, and current ICP by resetting flip-flop 41 and flip-flop 42. In FIG. 8, mask signal NMSK directly masks the UP signal and the DOWN signal. In FIG. 9, mask signal NMSK directly masks current ICP.

[3. Transmission System]

Next, a transmission system according to the embodiment will be described.

Figure 10:
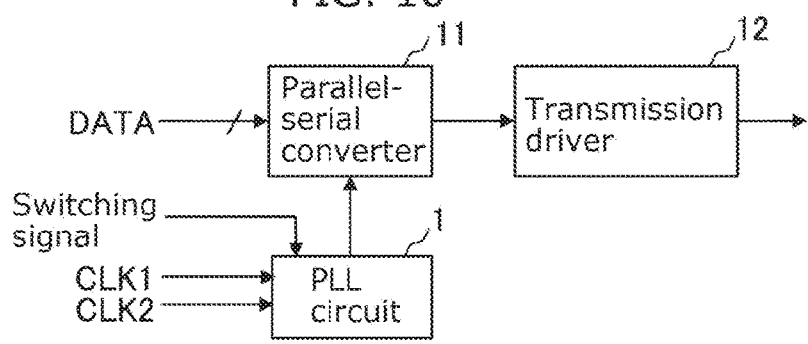
FIG. 10 is a block diagram illustrating an example of the configuration of a transmission system according to the embodiment.

FIG. 10 is a block diagram illustrating an example of the configuration of the transmission system according to the embodiment. The transmission system in FIG. 10 includes PLL circuit 1, parallel-serial converter 11, and transmission driver 12.

PLL circuit 1 may be configured as in FIG. 1. For example, one of first clock signal CLK1 and second clock signal CLK2 is a recovery clock and the other of first clock signal CLK1 and second clock signal CLK2 is a clock other than a recovery clock.

Parallel-serial converter 11 is a shift register that loads and outputs parallel data as serial data in synchronization with output clock signal VCLK from PLL circuit 1.

Transmission driver 12 outputs the serial data output from parallel-serial converter 11 to a communication line.

As described above, the PLL circuit according to the embodiment generates an output clock signal and includes: a selection circuit that selects one of a plurality of clock signals as a reference clock signal of the PLL circuit; and a control circuit that when a switch is made for the selection of the reference clock signal, temporarily reduces a division ratio used by a frequency divider that generates a feedback clock signal to be compared with the reference clock signal.

With the PLL circuit described above, frequency fluctuation of an output clock signal, which is caused by the switching of a reference clock signal, can be inhibited. Temporarily reducing a division ratio temporarily reduces the cycle of a feedback clock signal. For example, when the first edge timing of the feedback clock signal from the frequency divider is little delayed relative to the first edge timing of the reference clock signal immediately after switching, it is possible to match the edge timing of the reference clock signal in the next cycle with the edge timing of the feedback clock signal in the next cycle.

When the switch is made for the selection of the reference clock signal, the control circuit may temporarily mask a detection result obtained by a phase comparator in the PLL circuit.

With the above feature, when one of pulses of a reference clock signal and a feedback clock signal is output unnecessarily by mistake, a phase difference due to that unnecessary pulse can be masked. When glitch noise occurs in the reference clock signal at the time of switching for the selection of the reference clock signal, a phase difference due to the glitch noise can be masked. This can inhibit frequency fluctuation at the time of switching for the selection of the reference clock signal.

A PLL circuit according to the embodiment includes: an oscillator that generates an output clock signal; a frequency divider that divides the frequency of the output clock signal; a phase comparator that detects the phase difference between a reference clock signal and a feedback clock signal output from the frequency divider; a filter circuit that outputs, to the oscillator, a control signal in accordance with the detected phase difference; a selection circuit that selects and outputs, as the reference clock signal, one of a plurality of clock signals to the phase comparator; and a control circuit that when a switch is made for the selection of the reference clock signal, temporarily reduces a division ratio used by the frequency divider.

With the PLL circuit described above, frequency fluctuation of an output clock signal caused by the switching of a reference clock signal can be inhibited. Temporarily reducing a division ratio temporarily reduces the cycle of a feedback clock signal. For example, when the first edge timing of the feedback clock signal from the frequency divider is little delayed relative to the first edge timing of the reference clock signal immediately after switching, it is possible to match the edge timing of the reference clock signal in the next cycle with the edge timing of the feedback clock signal in the next cycle.

The control circuit may reset the frequency divider when the switch is made for the selection of the reference clock signal. A period in which the division ratio is temporarily reduced may be a single cycle or a plurality of cycles of the feedback clock signal immediately after reset cancel of the frequency divider.

With this feature, when the first edge timing of a feedback clock signal from the frequency divider is little delayed relative to the first edge timing of a reference clock signal immediately after switching, for example, an edge timing in the next cycle (or a cycle after few cycles) immediately after reset cancel can be matched between the reference clock signal and the feedback clock signal.

The control circuit may temporarily change the division ratio from N to (N-m) when the switch is made for the selection of the reference clock signal, where N may be an integer indicating a division ratio in a locked state before the reference clock signal is switched, and m may be an integer corresponding to the time difference between the edge timing of the reference clock signal immediately after the reference clock signal is switched and the start timing of the frequency divider immediately after reset cancel.

With this feature, edge timing of the feedback clock signal in the next cycle immediately after reset cancel can be matched with the first edge timing of the reference clock signal immediately after switching. As a result, frequency fluctuation can be inhibited to a large extent.

The control circuit may output a division ratio switching signal to the frequency divider, and the frequency divider may start dividing a frequency at a small division ratio in a period in which the division ratio switching signal is being asserted.

With this feature, the control of temporarily reducing a division ratio can be readily performed.

When the switch is made for the selection of the reference clock signal, the control circuit may temporarily mask a signal indicating the phase difference generated by the phase comparator.

With this feature, when one of pulses of a reference clock signal and a feedback clock signal is unnecessarily output by mistake at the time of switching for the selection of a reference clock signal, a phase difference due to that unnecessary pulse can be masked. When glitch noise occurs in a reference clock signal at the time of switching for the selection of the reference clock signal, a phase difference due to the glitch noise can be masked. This can inhibit frequency fluctuation at the time of switching for the selection of the reference clock signal.

The control circuit may cancel the masking when the phase difference between the reference clock signal and the feedback clock signal is less than a threshold.

With this feature, a period in which masking is effective can be optimized.

The selection circuit may have a stop period during which the selection circuit stops the output of the reference clock signal when the switch is made for the selection of the reference clock signal. The control circuit may bring the frequency divider into a reset state in the stop period and cancel the rest state of the frequency divider at the edge timing of the reference clock signal, where the edge timing occurs when the stop period is ended.

With this feature, unnecessary output of a reference clock signal can be prevented at the time of switching for the selection of the reference clock signal owing to a stop period and reset cancel, which in turn makes it possible to reduce the factors of frequency fluctuation.

The selection circuit may not output glitch noise when the switch is made for the selection of the reference clock signal.

With this feature, glitch noise that causes frequency fluctuation can be reduced at the time of switching for the selection of the reference clock signal.

A transmission system according to the embodiment includes: the above-described PLL circuit; a converter that converts parallel data into serial data in synchronization with the output clock signal; and a transmission driver that outputs the serial data to a communication line.

In the above-described embodiment, each of elements may be implemented by dedicated hardware or by executing a software program suitable for the element. Each of the elements may be implemented by a program executor such as a CPU or a processor reading and executing a software program recorded on, for instance, a semiconductor memory.

Although the PLL circuit and transmission system according to one or more aspects of the present disclosure have been described based on an embodiment, the present disclosure is not limited to the embodiment. Other embodiments obtained by various modifications of the embodiments that may be conceived by persons skilled in the art, as well as embodiments resulting from arbitrary combinations of elements from different embodiments that do not depart from the essence of the present disclosure are also included in one or more aspects of the present disclosure.

INDUSTRIAL APPLICABILITY

The present disclosure is applicable to a PLL circuit that can switch a reference clock signal.

The invention claimed is:

1. A phase-locked loop (PLL) circuit that generates an output clock signal, the PLL circuit comprising:
    a selection circuit that selects one of a plurality of clock signals as a reference clock signal of the PLL circuit; and
    a control circuit that when a switch is made for the selection of the reference clock signal, temporarily reduces a division ratio used by a frequency divider that generates a feedback clock signal to be compared with the reference clock signal,
    wherein the control circuit resets the frequency divider when the switch is made for the selection of the reference clock signal, and
    a period in which the division ratio is temporarily reduced is a single cycle or a plurality of cycles of the feedback clock signal immediately after reset cancel of the frequency divider.

2. The PLL circuit according to claim 1, wherein when the switch is made for the selection of the reference clock signal, the control circuit temporarily masks a detection result obtained by a phase comparator in the PLL circuit.

3. The PLL circuit according to claim 2, wherein the control circuit cancels the masking when a phase difference between the reference clock signal and the feedback clock signal is less than a threshold.

4. The PLL circuit according to claim 1, further comprising:
    an oscillator that generates the output clock signal;
    a phase comparator that detects a phase difference between the reference clock signal and a feedback clock signal output from the frequency divider; and
    a filter circuit that outputs, to the oscillator, a control signal in accordance with the phase difference detected.

5. The PLL circuit according to claim 4, wherein when the switch is made for the selection of the reference clock signal, the control circuit temporarily masks a signal indicating the phase difference generated by the phase comparator.

6. A phase-locked loop (PLL) circuit that generates an output clock signal, the PLL circuit comprising:
    a selection circuit that selects one of a plurality of clock signals as a reference clock signal of the PLL circuit; and
    a control circuit that when a switch is made for the selection of the reference clock signal, temporarily reduces a division ratio used by a frequency divider that generates a feedback clock signal to be compared with the reference clock signal, wherein
    the control circuit temporarily changes the division ratio from N to (N-m) when the switch is made for the selection of the reference clock signal, where N is an integer indicating a division ratio in a locked state before the reference clock signal is switched, and m is an integer corresponding to a time difference between an edge timing of the reference clock signal immediately after the reference clock signal is switched and a start timing of the frequency divider immediately after reset cancel.

7. The PLL circuit according to claim 1, wherein
    the control circuit outputs a division ratio switching signal to the frequency divider, and
    the frequency divider starts dividing a frequency at a small division ratio in a period in which the division ratio switching signal is being asserted.

8. A phase-locked loop (PLL) circuit that generates an output clock signal, the PLL circuit comprising:
    a selection circuit that selects one of a plurality of clock signals as a reference clock signal of the PLL circuit; and
    a control circuit that when a switch is made for the selection of the reference clock signal, temporarily reduces a division ratio used by a frequency divider that generates a feedback clock signal to be compared with the reference clock signal, wherein
    the selection circuit has a stop period during which the selection circuit does not output the reference clock signal when the switch is made for the selection of the reference clock signal, and
    the control circuit brings the frequency divider into a reset state in the stop period and cancels the reset state of the frequency divider at an edge timing of the reference clock signal, the edge timing occurring when the stop period is ended.

9. The PLL circuit according to claim 1, wherein the selection circuit does not output glitch noise when the switch is made for the selection of the reference clock signal.

10. A transmission system comprising:
    the PLL circuit according to claim 1;
    a converter that converts parallel data into serial data in synchronization with the output clock signal; and
    a transmission driver that outputs the serial data to a communication line.

* * * * *